(12) United States Patent
Park et al.

(10) Patent No.: US 8,372,695 B2
(45) Date of Patent: Feb. 12, 2013

(54) INTEGRATED CIRCUIT PACKAGING SYSTEM WITH STACK INTERCONNECT AND METHOD OF MANUFACTURE THEREOF

(75) Inventors: SangMi Park, Pucheon Si (KR); MinJung Kim, Kwangju (KR)

(73) Assignee: Stats Chippac Ltd., Singapore (SG)

( * ) Notice: Subject to any disclaimer, the term of this patent is extended or adjusted under 35 U.S.C. 154(b) by 2 days.

(21) Appl. No.: 12/950,631

(22) Filed: Nov. 19, 2010

(65) Prior Publication Data
US 2012/0126428 A1 May 24, 2012

(51) Int. Cl.
H01L 21/00 (2006.01)
H01L 23/28 (2006.01)
(52) U.S. Cl. .. 438/114; 438/464; 257/787; 257/E23.128
(58) Field of Classification Search .................. None
See application file for complete search history.

(56) References Cited

U.S. PATENT DOCUMENTS

| 6,388,333 | B1 | 5/2002 | Taniguchi et al. | |
| 6,798,057 | B2 | 9/2004 | Bolkin et al. | |
| 7,345,361 | B2 | 3/2008 | Mallik et al. | |
| 7,491,625 | B2* | 2/2009 | Bayan et al. | 438/460 |
| 7,714,453 | B2 | 5/2010 | Khan et al. | |
| 7,777,351 | B1 | 8/2010 | Berry et al. | |
| 2008/0073769 | A1 | 3/2008 | Wu et al. | |
| 2010/0171205 | A1 | 7/2010 | Chen et al. | |
| 2011/0006408 | A1* | 1/2011 | Liao | 257/660 |
| 2011/0074014 | A1* | 3/2011 | Pagaila et al. | 257/737 |

* cited by examiner

*Primary Examiner* — Alonzo Chambliss
(74) *Attorney, Agent, or Firm* — Ishimaru & Associates LLP; Mikio Ishimaru

(57) ABSTRACT

A method of manufacture of an integrated circuit packaging system includes: providing a package substrate having a substrate base side and a substrate stack side; mounting an integrated circuit over the substrate stack side; attaching a stack connector to the substrate stack side; forming an encapsulation over the stack connector and the integrated circuit; attaching an external connector to the substrate base side; attaching an adhesive tape to the external connector having spacing between the adhesive tape and the substrate base side; cutting a step portion in the encapsulation to expose the stack connector; cutting a singulation kerf in the package substrate having exit damage on the substrate base side; and removing the adhesive tape.

10 Claims, 5 Drawing Sheets

INTEGRATED CIRCUIT PACKAGING SYSTEM WITH STACK INTERCONNECT AND METHOD OF MANUFACTURE THEREOF

TECHNICAL FIELD

The present invention relates generally to an integrated circuit packaging system, and more particularly to a system for an integrated circuit packaging system with an interconnect.

BACKGROUND ART

The electronic industry continues to seek products that are lighter, faster, smaller, multi-functional, more reliable, and more cost-effective. The advent of multi-function electronic devices, such as cell phones that are also game platforms, cameras, Internet portals, and music or video players, has brought immense pressure on the electronics device manufacturers and the manufacturing companies that support them.

In an effort to meet such requirements, package assembly techniques have been developed for multi-chip packages (MCP) and chip stack packages. These types of packages combine two or more semiconductor chips in a single package, thereby realizing increased memory density, multi-functionality, and/or reduced package footprint.

However, the use of several chips in a single package does tend to reduce both reliability and yield. During post assembly testing, if just one chip in the multi-chip or chip stack package fails to meet the functional or performance specifications, the entire package fails, causing the good chip(s) to be discarded along with the failing chip. As a result, multi-chip and chip stack packages tend to lower the productivity from the assembly process.

Thus, a need still remains for an integrated circuit packaging system with smaller size, more functionality, and improved reliability. In view of the ever-increasing need to improve integration and cost reduction, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a package substrate having a substrate base side and a substrate stack side; mounting an integrated circuit over the substrate stack side; attaching a stack connector to the substrate stack side; forming an encapsulation over the stack connector and the integrated circuit; attaching an external connector to the substrate base side; attaching an adhesive tape to the external connector having spacing between the adhesive tape and the substrate base side; cutting a step portion in the encapsulation to expose the stack connector; cutting a singulation kerf in the package substrate having exit damage on the substrate base side; and removing the adhesive tape.

The present invention provides an integrated circuit packaging system, including: a package substrate having a substrate base side and a substrate stack side; an integrated circuit over the substrate stack side; a stack connector attached to the substrate stack side; an encapsulation over the stack connector and the integrated circuit, the encapsulation having a step portion exposing the stack connector; an external connector attached to the substrate base side; and a singulation kerf in the package substrate having exit damage on the substrate base side characteristic of an adhesive tape attached to the external connector having spacing between the adhesive tape and the substrate base side.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
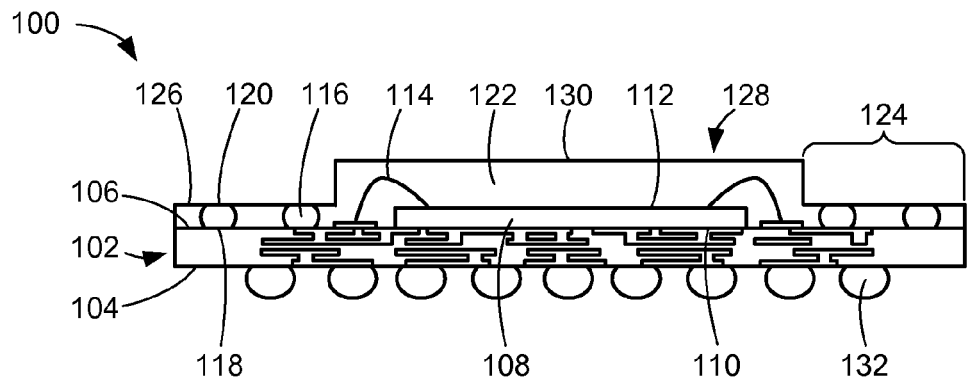
FIG. 1 is a cross-sectional view of an integrated circuit packaging system taken along line 1-1 of FIG. 2 in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing figures. Similarly, although the views in the drawings for ease of description generally show similar orientations, this depiction in the figures is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Previous process flow needs two sequences of package mounting and singulation process steps. Such process flow requires additional time to prepare or wait before proceeding with each of the process steps as well as requires additional mounting tape material for singulation. An embodiment of the present invention provides cost reduction for package development by providing process reduction for plastic ball grid array package-on-package bottom (PBGA-PoPb) package with exposed solder-on-pad (eSOP) without any additional processes or materials.

Figure 2:
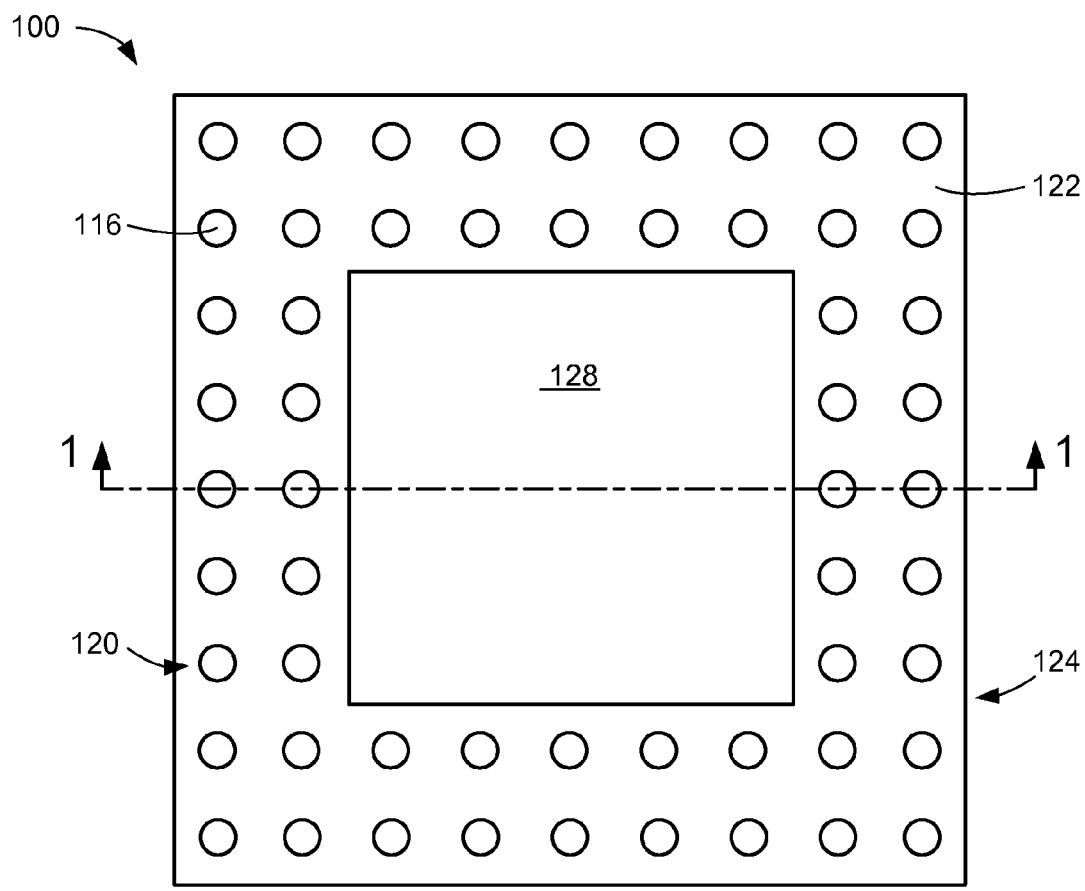
FIG. 2 is a top view of the integrated circuit packaging system.

Referring now to FIG. 1, therein is shown a cross-sectional view of an integrated circuit packaging system 100 taken along line 1-1 of FIG. 2 in an embodiment of the present invention. The integrated circuit packaging system 100 can include a method of manufacture of a package on package with exposed solder-on-pad (eSOP). The integrated circuit packaging system 100 can include two spindle heads at one machine. One of the spindle heads can be used for half cut and another of the spindle heads can be used for package singulation.

The integrated circuit packaging system 100 can include a package substrate 102, which is a support structure formed to mount a semiconductor device thereon and electrically connect or attach the semiconductor device thereto. The package substrate 102 can include a substrate base side 104 and a substrate stack side 106 opposite the substrate base side 104. The package substrate 102 can include a number of pads, vertical insertion areas (vias), conductive layers, or a combination thereof to provide electrical connectivity between the substrate base side 104 and the substrate stack side 106.

The integrated circuit packaging system 100 can include an integrated circuit 108, which is a semiconductor device. The integrated circuit 108 can include an inactive side 110 and an active side 112 opposite the inactive side 110.

The integrated circuit 108 can include the inactive side 110 facing or on the substrate stack side 106. The integrated circuit 108 can be mounted over a central portion of the substrate stack side 106.

The integrated circuit packaging system 100 can include a number of device connectors 114, which electrically connect or attach the package substrate 102 and the integrated circuit 108. The device connectors 114 can be connected or attached to the substrate stack side 106 and the active side 112.

The device connectors 114 can be connected or attached near a periphery of the integrated circuit 108. The device connectors 114 can be formed adjacent a non-horizontal side of the integrated circuit 108. For illustrative purposes, the device connectors 114 are shown as bond wires, although it is understood that the device connectors 114 can include any electrical connectors.

The integrated circuit packaging system 100 can include a number of stack connectors 116, which are electrically conductive connectors. The stack connectors 116 can be connected or attached near non-horizontal ends or a periphery of the package substrate 102. The stack connectors 116 can be adjacent the device connectors 114. For example, the stack connectors 116 can include exposed solder-on-pad (eSOP).

Each of the stack connectors 116 can include a base end 118 and a stack end 120 opposite the base end 118. The base end 118 can be electrically connected or attached to the substrate stack side 106. The base end 118 can be connected or attached directly on the substrate stack side 106.

For illustrative purposes, the stack connectors 116 are shown as elliptical, although it is understood that the stack connectors 116 can include any shapes. Also for illustrative purposes, each of the stack connectors 116 is shown having a width larger than a height, although it is understood that the stack connectors 116 can include any widths or any heights.

The integrated circuit packaging system 100 can include an encapsulation 122, which covers a semiconductor package to seal a semiconductor device providing mechanical and environmental protection. The encapsulation 122 can be formed over the substrate stack side 106, the integrated circuit 108, the device connectors 114, and the stack connectors 116.

The encapsulation 122 can be formed covering the integrated circuit 108, the device connectors 114, and portions of the stack connectors 116. The encapsulation 122 can be formed partially exposing the stack connectors 116. The encapsulation 122 can be formed exposing the stack end 120.

The encapsulation 122 can include a step portion 124, which is a portion at a perimeter of the encapsulation 122. The step portion 124 can be over the substrate stack side 106. The step portion 124 can be formed covering portions of the stack connectors 116. The step portion 124 can include a step top side 126, at which the stack end 120 can be exposed.

A plane of a portion of the stack end 120 can be coplanar with a plane of a portion of the step top side 126. A plane of a portion of the stack end 120 can be coplanar with a plane of a portion of another of the stack end 120.

The encapsulation 122 can include a protrusion 128, which extends upwardly from the step top side 126. The protrusion 128 can be formed at a central portion of the encapsulation 122. The protrusion 128 can be formed between the step portion 124 and another of the step portion 124.

The protrusion 128 can be formed over the integrated circuit 108 and the device connectors 114. The protrusion 128 can be formed covering the integrated circuit 108 and the device connectors 114.

The protrusion 128 can include a protrusion top side 130, which is a top extent of the encapsulation 122. The protrusion top side 130 can be above the step top side 126.

The integrated circuit packaging system 100 can include a number of external connectors 132, which are electrical connectors that provide electrical connectivity between the package substrate 102 and an external system (not shown). The external connectors 132 can be connected or attached to the substrate base side 104.

It has been discovered that the stack connectors 116, each of which having the stack end 120 coplanar with the step top side 126, provides more flat contact area resulting in a robust interconnection structure for mounting a package thereon.

Referring now to FIG. 2, therein is shown a top view of the integrated circuit packaging system 100. The integrated circuit packaging system 100 can include a number of the stack connectors 116 formed in a peripheral array or with multiple rows at the step portion 124 of the encapsulation 122.

The encapsulation 122 can expose the stack end 120 at the step portion 124. For illustrative purposes, the encapsulation 122 is shown having the protrusion 128 surrounded by the stack connectors 116, although it is understood that the stack connectors 116 can be formed only along or adjacent a number of sides of the protrusion 128. Also for illustrative purposes, the encapsulation 122 is shown having the protrusion 128 surrounded by the step portion 124, although it is understood that the step portion 124 can be formed only along or adjacent a number of sides of the protrusion 128.

Figure 3:
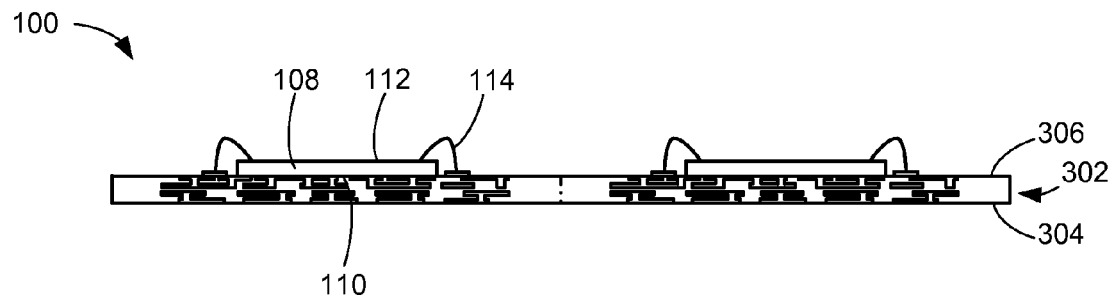
FIG. 3 is a cross-sectional view of the integrated circuit packaging system in a first connecting phase of manufacture.

Referring now to FIG. 3, therein is shown a cross-sectional view of the integrated circuit packaging system 100 in a first connecting phase of manufacture. The integrated circuit packaging system 100 can include a substrate strip 302, which is a support structure provided to mount a number of semiconductor devices thereon and electrically connect or attach a number of the semiconductor device thereto.

The substrate strip 302 can include a number of substrates that can be contiguously formed as a single integral structure. The substrate strip 302 can be singulated in a subsequent phase at non-horizontal sides of the substrates. For example, one of the non-horizontal sides of the substrates is shown as a dash line.

The substrate strip 302 can include a strip base side 304 and a strip stack side 306 opposite the strip base side 304. The substrate strip 302 can include a number of pads, vertical insertion areas (vias), conductive layers, or a combination thereof to provide electrical connectivity between the strip base side 304 and the strip stack side 306.

The integrated circuit packaging system 100 can include a number of the integrated circuit 108 having the inactive side 110 and the active side 112. The integrated circuit 108 can be mounted over the substrate strip 302 with the inactive side 110 facing or on the strip stack side 306.

The integrated circuit 108 can be attached to the substrate strip 302 with a die attach method. The integrated circuit 108 can be attached with an attach layer (not shown) directly attached to the strip stack side 306 and the inactive side 110.

The first connecting phase can include a connection method including wire bonding to connect or attach the device connectors 114. A number of the device connectors 114 can be connected or attached to the strip stack side 306 and the active side 112. The device connectors 114 can be formed adjacent a non-horizontal side of the integrated circuit 108.

Figure 4:
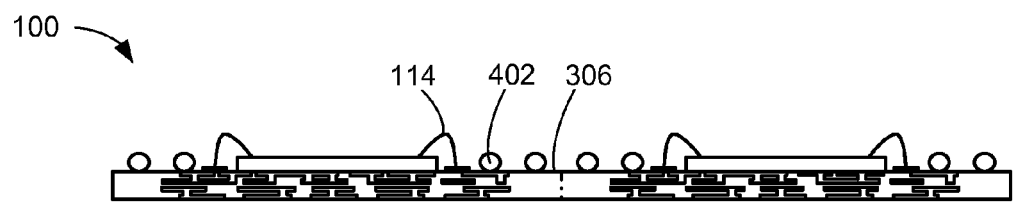
FIG. 4 is the structure of FIG. 3 in a second connecting phase.

Referring now to FIG. 4, therein is shown the structure of FIG. 3 in a second connecting phase. The second connecting phase can include a connection method including solder ball mount on top pad.

The integrated circuit packaging system 100 can include a number of top connectors 402, which are electrically conductive connectors, adjacent the device connectors 114. The top connectors 402 can be connected or attached directly on the strip stack side 306.

The top connectors 402 include interconnects including conductive balls or conductive bumps. The top connectors 402 can be formed with a conductive material including solder, a metal, or a metallic alloy. For example, the top connectors 402 can include solder balls.

Figure 5:
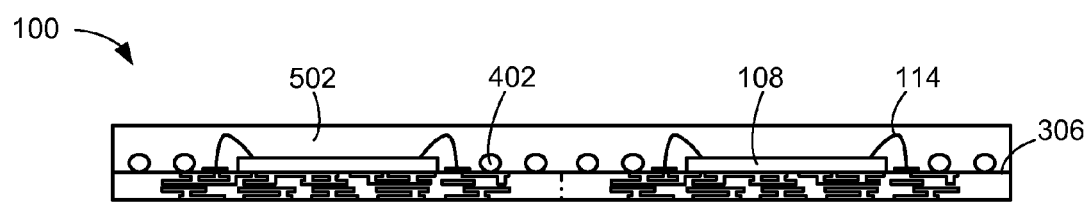
FIG. 5 is the structure of FIG. 4 in a molding phase.

Referring now to FIG. 5, therein is shown the structure of FIG. 4 in a molding phase. The integrated circuit packaging system 100 can include a mold cap 502, which covers a semiconductor package to seal a semiconductor device providing mechanical and environmental protection.

The mold cap 502 can include a cover including an encapsulant or a mold material. The mold cap 502 can be formed over the strip stack side 306, the integrated circuit 108, the device connectors 114, and the top connectors 402.

Figure 6:
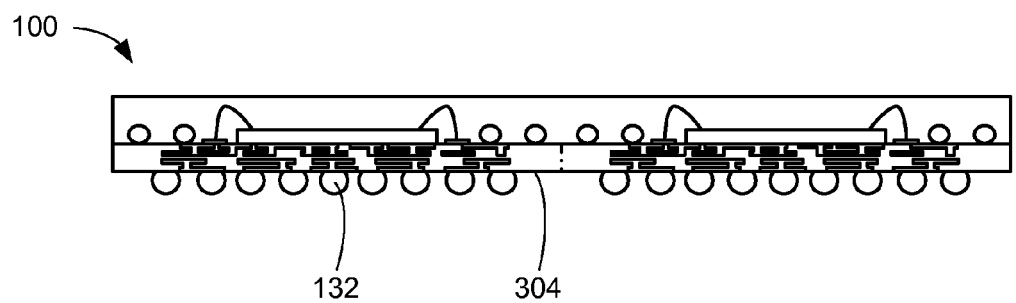
FIG. 6 is the structure of FIG. 5 in a third connecting phase.

Referring now to FIG. 6, therein is shown the structure of FIG. 5 in a third connecting phase. The third connecting phase can include a connection method including solder ball mount on bottom pad.

The integrated circuit packaging system 100 can include a number of the external connectors 132 connected or attached to the strip base side 304. The external connectors 132 can include interconnects including conductive balls or conductive bumps. The external connectors 132 can be formed with a conductive material including solder, a metal, or a metallic alloy. For example, the external connectors 132 can include solder balls.

It has been discovered that changing a process flow by connecting or attaching the external connectors 132 prior to tape mounting and removal processes significantly reduces manufacture cost by reducing manufacturing processes from two sequences to one sequence of the tape mounting and removal processes in subsequent phases.

Figure 7:
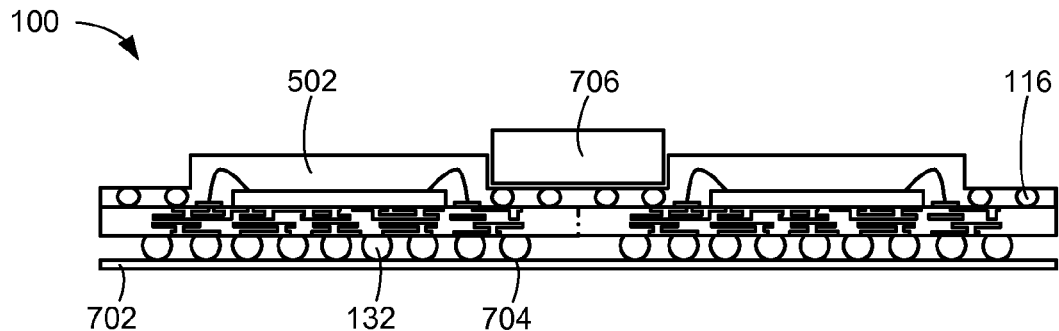
FIG. 7 is the structure of FIG. 6 in a partial removal phase.

Referring now to FIG. 7, therein is shown the structure of FIG. 6 in a partial removal phase. The partial removal phase can include a removal method including package saw process or thick blade first step cut. For example, the integrated circuit packaging system 100 can include a system having a strip type substrate loader, a mounting tape, a package saw, a chuck table, a jig, or a combination thereof.

The integrated circuit packaging system 100 can include a package mounting process that securely attaches the external connectors 132 to a mounting platform (not shown). The integrated circuit packaging system 100 can include an adhesive tape 702, which attaches bottom portions 704 of the external connectors 132 to the mounting platform.

For example, the adhesive tape 702 can include a mounting tape, an adhesion tape, a lamination tape, or a dicing tape. Also for example, the adhesive tape 702 can include a thick and strong attach material.

The integrated circuit packaging system 100 can include a first blade 706, which is a portion of a cutting tool including a saw. For illustrative purposes, the integrated circuit packaging system 100 is shown with the first blade 706 as a saw blade, although it is understood that the integrated circuit packaging system 100 can include any other cutting portions of removal equipments or any types of blades.

The first blade 706 can remove or cut a portion of the mold cap 502. The first blade 706 can remove portions of the top connectors 402 of FIG. 4 forming the stack connectors 116. For example, the first blade 706 can include a first spindle (SP1), a thick blade, or a blade for half cut.

It has been discovered that the adhesive tape 702 significantly improves reliability by protecting the bottom portions 704 of the external connectors 132 from damages during saw processes.

It has also been discovered that the adhesive tape 702 greatly reduces manufacture cost without a need for additional jigs.

It has further been discovered that attaching the adhesive tape 702 only once prior to partially removing the mold cap 502 and the top connectors 402 significantly improves manufacturing productivity with increase in units per hour (UPH) as well as reducing manufacture cost.

Figure 8:
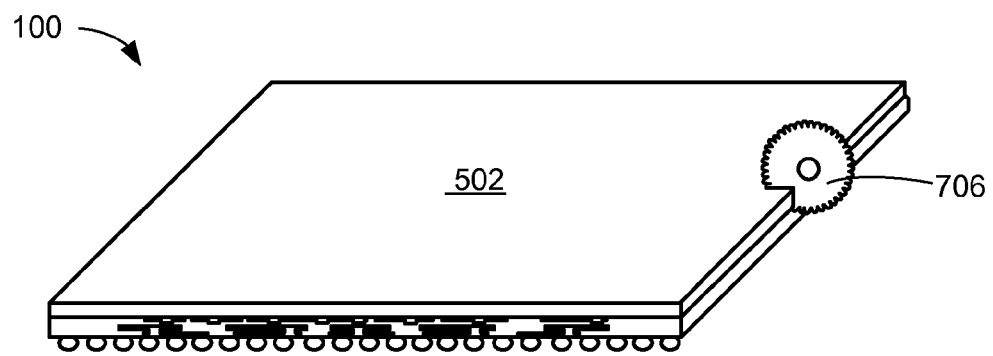
FIG. 8 is an isometric top view of the integrated circuit packaging system in the partial removal phase.

Referring now to FIG. 8, therein is shown an isometric top view of the integrated circuit packaging system 100 in the partial removal phase. The isometric top view is shown with the mold cap 502 in a process of being partially removed. The first blade 706 can partially remove the mold cap 502.

Figure 9:
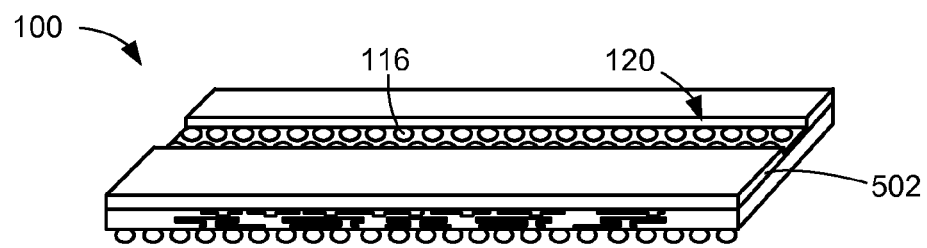
FIG. 9 is the structure of FIG. 8 with the stack connector exposed.

Referring now to FIG. 9, therein is shown the structure of FIG. 8 with the stack connector exposed. The stack end 120 of each of the stack connectors 116 can be exposed from the mold cap 502.

Figure 10:
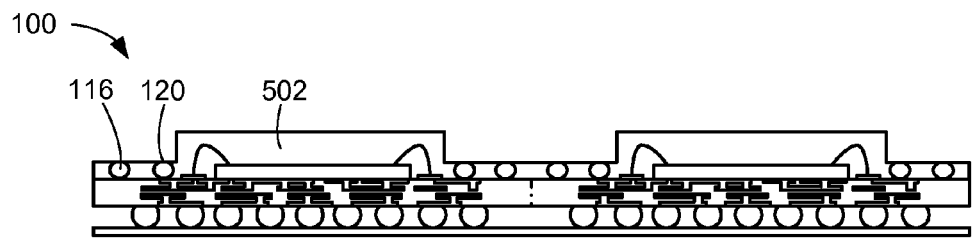
FIG. 10 is a cross-sectional view of the integrated circuit packaging system in the partial removal phase.

Referring now to FIG. 10, therein is shown a cross-sectional view of the integrated circuit packaging system 100 in the partial removal phase. The mold cap 502 can be partially removed.

The top connectors 402 of FIG. 4 can be partially removed forming the stack connectors 116. The stack connectors 116 can be partially exposed from the mold cap 502. The stack end 120 of each of the stack connectors 116 can be exposed from the mold cap 502.

Figure 11:
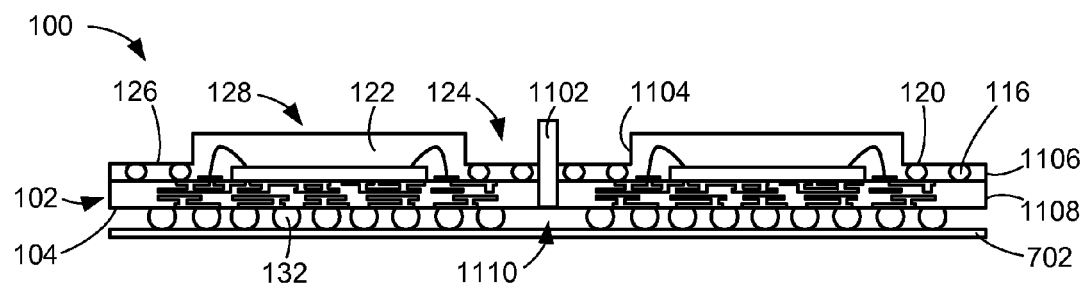
FIG. 11 is the structure of FIG. 10 in a singulation phase.

Referring now to FIG. 11, therein is shown the structure of FIG. 10 in a singulation phase. The singulation phase can include a singulation process to produce individual units or packages of the integrated circuit packaging system 100. For example, the singulation process can include a package saw process, a thin blade second step cut, or a second spindle cut.

The integrated circuit packaging system 100 can include a second blade 1102, which is a portion of a cutting tool including a saw. For illustrative purposes, the integrated circuit packaging system 100 is shown with the second blade 1102 as a saw blade, although it is understood that the integrated circuit packaging system 100 can include any other cutting portions of removal equipments or any types of blades for package singulation.

The second blade 1102 can include a width less than a width of the first blade 706 of FIG. 7. Widths of the first blade 706 and the second blade 1102 are horizontal distances between horizontal extents of the first blade 706 and the second blade 1102, respectively. For example, the second blade 1102 can include a second spindle (SP2) or a thin blade.

The second blade 1102 can cut a portion of the mold cap 502 of FIG. 5 forming the encapsulation 122 having the step portion 124 and the protrusion 128. The second blade 1102 can singulate or cut through the substrate strip 302 of FIG. 3 forming the package substrate 102.

The stack connectors 116, the step portion 124, and the protrusion 128 can include characteristics of being formed with the first blade 706. The characteristics of being formed with the first blade 706 can include the stack end 120 of each of the stack connectors 116, the step top side 126 of the step portion 124, and a protrusion non-horizontal side 1104 of the protrusion 128 having cut marks or uneven surfaces.

The step portion 124 and the package substrate 102 can include characteristics of being formed with the second blade 1102. The characteristics of being formed with the second blade 1102 can include a peripheral non-horizontal side 1106 of the step portion 124 and a substrate non-horizontal side 1108 of the package substrate 102 having cut marks or uneven surfaces.

The mold cap 502 and the substrate strip 302 can be cut with the second blade 1102 forming a singulation kerf 1110 through the mold cap 502 and the substrate strip 302. The singulation kerf 1110 is a channel or a slit made with a cut in the mold cap 502 or the substrate strip 302.

The adhesive tape 702 can be at a spacing to the substrate base side 104. With the substrate base side 104 unsupported by the adhesive tape 702, the step portion 124 and the package substrate 102 can include additional characteristics of being formed with the second blade 1102.

The additional characteristics of being formed with the second blade 1102 can include exit damage from a cutting component of the second blade 1102 as it exits the package substrate 102 during cutting. Cutting damage such as the exit damage can include chipped surfaces at the substrate base side 104 near the substrate non-horizontal side 1108. A number of chipped surfaces at an exit side such as the substrate base side 104 can be greater than a number of chipped surfaces at an entry side such as the step top side 126.

The additional characteristics of being formed with the second blade 1102 can also include the cutting damage including fragments of the package substrate 102 directly on the substrate base side 104. The fragments of the package substrate 102 can be near the substrate non-horizontal side 1108. A number of fragments at the exit side such as the substrate base side 104 can be greater than a number of fragments at the entry side such as the step top side 126.

It has been discovered that damage at the step top side 126 less than damage at the substrate base side 104 eliminates damage to the stack connectors 116 resulting in improved reliability.

It has unexpectedly been found that a single tape for support and mounting purposes with the adhesive tape 702 attached to the external connectors 132 eliminates damage to active elements but increases damage to inactive regions such as the substrate base side 104 thereby improving manufacturing throughput and maintaining yield.

Figure 12:
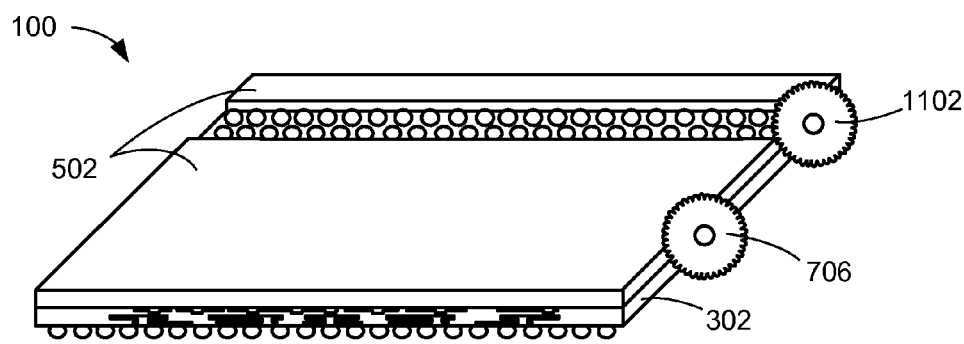
FIG. 12 is an isometric top view of the integrated circuit packaging system in the singulation phase.

Referring now to FIG. 12, therein is shown an isometric top view of the integrated circuit packaging system 100 in the singulation phase. The isometric top view is shown with a portion of the mold cap 502 and a portion of the substrate strip 302 in a process of being partially removed with the second blade 1102. The isometric top view is also shown with the first blade 706 partially removing another portion of the mold cap 502.

For example, the second blade 1102 can be used for package singulation after the first blade 706 has cut pass saw lines. Also for example, the first blade 706 and the second blade 1102 can be used simultaneously with each of the first blade 706 and the second blade 1102 at a different portion of the mold cap 502.

Figure 13:
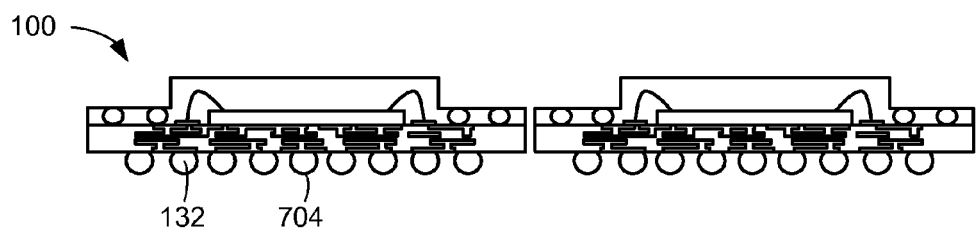
FIG. 13 is the structure of FIG. 11 in a tape removal phase.

Referring now to FIG. 13, therein is shown the structure of FIG. 11 in a tape removal phase. The adhesive tape 702 of FIG. 7 can be removed from the bottom portions 704 of the external connectors 132. The tape removal phase can include a removal process including ultraviolet (UV) irradiation.

The external connectors 132 can include characteristics of being attached to the adhesive tape 702. The characteristics of being attached to the adhesive tape 702 can include a surface area of a portion of one of the external connectors 132 having a tacky surface or adhesive residue. For example, the portion of one of the external connectors 132 can include one of the bottom portions 704 of the external connectors 132.

It has been discovered that removing the adhesive tape 702 only once after the singulation phase significantly reduces manufacture cost in terms of time and material reduction.

Figure 14:
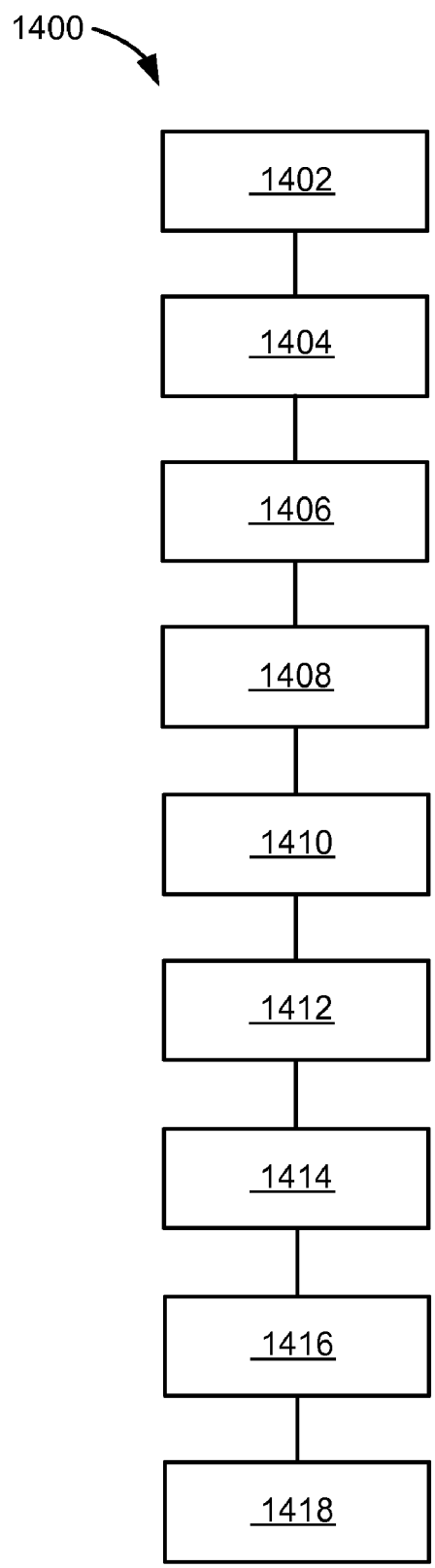
FIG. 14 is a flow chart of a method of manufacture of the integrated circuit packaging system in a further embodiment of the present invention.

Referring now to FIG. 14, therein is shown a flow chart of a method 1400 of manufacture of the integrated circuit packaging system 100 in a further embodiment of the present invention. The method 1400 includes: providing a package substrate having a substrate base side and a substrate stack side in a block 1402; mounting an integrated circuit over the substrate stack side in a block 1404; attaching a stack connector to the substrate stack side in a block 1406; forming an encapsulation over the stack connector and the integrated circuit in a block 1408; attaching an external connector to the substrate base side in a block 1410; attaching an adhesive tape to the external connector having spacing between the adhesive tape and the substrate base side in a block 1412; cutting a step portion in the encapsulation to expose the stack connector in a block 1414; cutting a singulation kerf in the package substrate having exit damage on the substrate base side in a block 1416; and removing the adhesive tape in a block 1418.

Thus, it has been discovered that the integrated circuit packaging system of the present invention furnishes important and heretofore unknown and unavailable solutions, capabilities, and functional aspects for an integrated circuit packaging system with an interconnect. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a package substrate having a substrate base side and a substrate stack side;
   mounting an integrated circuit over the substrate stack side;
   attaching a stack connector to the substrate stack side;
   forming an encapsulation over the stack connector and the integrated circuit;
   attaching external connectors to the substrate base side;
   attaching an adhesive tape to the external connectors having spacing between the adhesive tape and the substrate base side;
   cutting a step portion in the encapsulation to expose the stack connector after attaching the adhesive tape to the external connectors;
   cutting a singulation kerf in the package substrate; and
   removing the adhesive tape.

2. The method as claimed in claim 1 wherein cutting the step portion includes cutting the step portion in the encapsulation having a protrusion surrounded by the step portion.

3. The method as claimed in claim 1 wherein cutting the step portion includes cutting the step portion in the encapsulation to expose the stack connector having a stack end coplanar with a step top side of the step portion.

4. The method as claimed in claim 1 wherein cutting the step portion includes cutting the step portion in the encapsulation having a protrusion extending from a step top side of the step portion.

5. The method as claimed in claim 1 wherein attaching the stack connector includes attaching stack connectors to the substrate stack side.

6. A method of manufacture of an integrated circuit packaging system comprising:
   providing a package substrate having a substrate base side and a substrate stack side;
   mounting an integrated circuit over the substrate stack side;
   connecting a device connector to the integrated circuit and the substrate stack side;
   attaching a stack connector to the substrate stack side;
   forming an encapsulation over the stack connector and the integrated circuit;
   attaching external connectors to the substrate base side;
   attaching an adhesive tape to the external connectors having spacing between the adhesive tape and the substrate base side;
   cutting a step portion in the encapsulation to expose the stack connector after attaching the adhesive tape to the external connectors;
   cutting a singulation kerf in the package substrate; and
   removing the adhesive tape.

7. The method as claimed in claim 6 wherein cutting the step portion includes cutting the step portion in the encapsulation having a protrusion surrounded by the step portion and over the device connector.

8. The method as claimed in claim 6 wherein cutting the step portion includes cutting the step portion in the encapsulation to expose the stack connector having a stack end coplanar with a step top side of the step portion, the stack connector adjacent the device connector.

9. The method as claimed in claim 6 wherein cutting the step portion includes cutting the step portion in the encapsulation having a protrusion covering the integrated circuit and extending from a step top side of the step portion.

10. The method as claimed in claim 6 wherein:
    attaching the stack connector includes attaching stack connectors to the substrate stack side; and
    cutting the step portion includes cutting the step portion in the encapsulation having a protrusion surrounded by the stack connectors.

* * * * *